United States Patent
Wang (10) Patent No.: US 11,320,675 B2
(45) Date of Patent: May 3, 2022

(54) AUTOMATIC BIAS CONTROL OF AN OPTICAL TRANSMITTER

(71) Applicant: ARRIS Enterprises LLC, Suwanee, GA (US)

(72) Inventor: Jun Wang, Warrington, PA (US)

(73) Assignee: ARRIS Enterprises LLC, Suwanee, GA (US)

(*) Notice: Subject to any disclaimer, the term of this patent is extended or adjusted under 35 U.S.C. 154(b) by 207 days.

(21) Appl. No.: 16/221,395

(22) Filed: Dec. 14, 2018

(65) Prior Publication Data

US 2020/0192129 A1    Jun. 18, 2020

(51) Int. Cl.
| | |
|---|---|
| G02F 1/03 | (2006.01) |
| G02B 26/00 | (2006.01) |
| H01L 29/06 | (2006.01) |
| G02F 1/035 | (2006.01) |
| G02B 6/12 | (2006.01) |
| G02F 1/01 | (2006.01) |
| H01S 5/12 | (2021.01) |
| G02F 1/17 | (2019.01) |
| G02F 1/00 | (2006.01) |
| G02F 1/015 | (2006.01) |

(52) U.S. Cl.
CPC .......... *G02F 1/0123* (2013.01); *G02F 1/0063* (2013.01); *G02F 1/174* (2013.01); *H01S 5/12* (2013.01); *G02F 1/0155* (2021.01)

(58) Field of Classification Search
CPC ..... G02F 1/12255; G02B 5/23; G02B 26/001; G02B 6/43; H04B 10/505; H01L 29/2003; B82Y 20/00; H01S 3/0604; H01S 3/113; H01S 3/1109; H01S 3/16; H01S 3/0941

USPC ..... 359/245, 241, 240, 248, 237; 372/45.01, 372/45.011, 7, 11, 18, 43, 45, 48, 68, 75; 257/14–15, 18, 189, 622–623; 385/2, 14, 385/31; 398/198

See application file for complete search history.

(56) References Cited

U.S. PATENT DOCUMENTS

| | | |
|---|---|---|
| 9,479,263 B2 | 10/2016 | Schemmann et al. |
| 2003/0043448 A1 | 3/2003 | Bond et al. |
| | (Continued) | |

OTHER PUBLICATIONS

PCT/US2019/066232, International Search Report and Written Opinion.

(Continued)

*Primary Examiner* — Dawayne Pinkney
(74) *Attorney, Agent, or Firm* — Chernoff, Vilhauer, McClung & Stenzel, LLP (57) ABSTRACT

In one embodiment, an electro-absorption modulator receives an optical light from an optical light source and outputs a modulated optical signal. The electro-absorption modulator includes a bias voltage used to set a predetermined modulation performance and an output power of the electro-absorption modulator. A controller measures a photocurrent generated by the electro-absorption modulator and uses the photocurrent as a reference to automatically control the bias voltage of the electro-absorption modulator to maintain the predetermined modulation performance and the output power of the electro-absorption modulator when a detuning change occurs between the electro-absorption modulator and the optical light source throughout the lifetime of transmitters based on an EML device.

20 Claims, 8 Drawing Sheets

(56) References Cited

U.S. PATENT DOCUMENTS

| | | | |
|---|---|---|---|
| 2004/0090659 A1 | 5/2004 | Zhang et al. | |
| 2005/0276615 A1 | 12/2005 | Ranganath | |
| 2006/0208180 A1* | 9/2006 | Zhang | G01J 1/04 |
| | | | 250/238 |
| 2015/0288457 A1 | 10/2015 | Schemmann et al. | |

OTHER PUBLICATIONS

Milind Gokhale, "20 and 26 Gbps uncooled 1310nm EMLs for 100 GbE applications", IEEE High Speed Study Group, Apogee Photonics, Jan. 2007, 13 pages.

* cited by examiner

AUTOMATIC BIAS CONTROL OF AN OPTICAL TRANSMITTER

BACKGROUND

Optical communications systems use modulated light, e.g., optical signals, through light channels or fiber optic cables to transmit information between devices. For example, long distance transmission of broadband signal content, such as analog multichannel video, may include the use of narrow line width light sources in conjunction in a low loss wavelength window of single mode optical fibers (SMF). In optical communication systems, a light beam is modulated in accordance with the information to be conveyed and transmitted along the optical fiber to a receiver.

The typical lowest loss of the SMF fiber window is in the convention band (C-band). In addition to the low loss in this window, the availability of the optical amplifier in this wavelength window is another advantage. There are two types of modulation that can be used for the light modulation, direct modulation and external modulation. In the direct modulation transmitter, light of a distributed feedback laser (DFB) laser is directly modulated through the modulation of the current going to the laser. In an external modulation transmitter, the light from the light source is modulated by an optical external modulator.

The direct modulation transmitter is a cost-effective solution for many applications. Accompanying the intensity modulation of the light is the frequency modulation of the light, known as laser chirp. However, one factor that the optical transmission system needs to consider is the fiber dispersion. The interaction of the laser chirp with the fiber dispersion can cause some undesirable performance degradations, such as second order distortion in analog hybrid fiber coax (HFC) cable television (CATV) transmission systems. The distortion can be corrected through an electronic circuit. However, since the fiber dispersion is the function of fiber length, the distortion correction has to be set for each targeted fiber length. Therefore, this may add some additional tuning during network implementation. Also, this may cause some limitations in certain applications. For example, when the light is split in the transmission path and each portion of the split light travels down to different fiber lengths, performing a distortion correction becomes difficult to satisfy both transmission lengths. The other example is when a primary link and a secondary link have different link lengths the distortion correction needs to be reset after a switching happens between the primary and secondary path. Furthermore, the electronic distortion correction has its own limit in terms of its correction capability, which limits the total transmission link length.

To overcome the aforementioned drawbacks of the directly modulated transmitter, an external modulation transmitter may be used, especially for long reach transmission applications since external transmitters are close to chirp free. There are different types of external modulator technologies, such as a lithium niobite (LN) based Mach-Zehnder (MZ) modulator and an electro-absorption based modulator.

For LN MZ transmitters, the light from the light source is split equally and each split is sent to phase modulator path in the MZ modulator. The phase of the light from each path is controlled by the voltage applied to the phase modulator through an electro-optic effect. The lights from the two paths of the phase modulator are then combined and interfere. If the phase difference between the two light beams are zero degrees, then the max optical output power is achieved. If the phase difference between the two light beams is 180 degrees, then the minimum optical output power is achieved. The LN MZ based external modulator thus provides very good analog performance over long transmission distance not only because its low modulator chirp, but also because of its intrinsic good second order distortion performance if biased at its quadrature point. However, LN MZ transmitters also suffer some drawbacks. First of all, the best second order distortion performance can only be achieved at a quadrature point of the modulator transfer function and a small bias deviation from that point makes the distortion degrade very quickly. Therefore, the modulator voltage bias for the best performance needs to be constantly monitored and controlled because of its drift. Secondly, the modulator is bulky. Thirdly, it is very costly as compared to the directly modulated transmitter.

An electro-absorption (EA) based external modulator is based on the Franz-Keldysh effect or quantum-confined Stark effect, where the effective band gap of the semiconductor of the absorption material of the modulator changes with its bias voltage. The absorbed light is converted to photocurrent and therefore the electro-absorption modulator (EAM) works in a similar way to that of a photodetector. When no bias voltage is applied to the electro-absorption modulator, the band gap is wide enough to allow the light at the laser wavelength to pass through transparently. As the bias voltage is increased, the band gap is narrowed enough to start absorbing the light. Therefore, changing the bias voltage of the electro-absorption modulator modulates light. The electro-absorption modulator based external transmitters have several advantages. First, the electro-absorption modulator has a much lower chirp as compared to the directly modulated DFB laser. Second, the electro-absorption modulator requires a low bias voltage and driving power for modulation. Third, the electro-absorption modulator can be integrated with a DFB laser to form a device called an EML (electro-absorption modulated laser). Because of this integration, the EML device is very small with a package similar to a normal DFB laser, and therefore very cost effective. Like LN MZ modulator, the best second order distortion is achieved only when the modulator is biased at its inflection point of its extinction ratio (ER) curve. The inflection point is where the ER curve changes in its curvature from concave up to concave down. However, EA modulators also have some drawbacks. First, also like the LN MZ modulator, a small EAM bias deviation can make transmitter distortion degrade very fast or the bias voltage needs to stay in an extremely narrow window in order for distortions to be acceptable. Second, its best distortion bias voltage is a function of wavelength of the light and therefore a change in light wavelength induced for any reason can cause a system performance degradation.

DETAILED DESCRIPTION

Described herein are techniques for an optical transmission system. In the following description, for purposes of explanation, numerous examples and specific details are set forth in order to provide a thorough understanding of some embodiments. Some embodiments as defined by the claims may include some or all of the features in these examples alone or in combination with other features described below, and may further include modifications and equivalents of the features and concepts described herein.

In an optical communication system, information is transmitted via message signals through a physical medium from a source to a destination. For example, a cable-based system can be used to deliver analog and/or high-definition digital entertainment and telecommunications, such as video, voice, and high-speed internet services, from a headend to subscribers over an existing cable television network using optical signals. The cable television network can take the form of an all-fiber network or hybrid fiber/coax (HFC) network. In either network, an optical communication system, such as an optical transmitter, in a headend/hub converts electrical signals (e.g., data, video, and voice signals) to optical signals. The optical signals are transmitted downstream via a fiber to a fiber node that serves a group of end users (e.g., a service group). The fiber node can include an optical receiver that converts the received optical signals to electrical signals that then are transmitted to the service group, for example, via receiving devices such as cable modems (CMs) and/or set top boxes (STBs).

Figure 1:
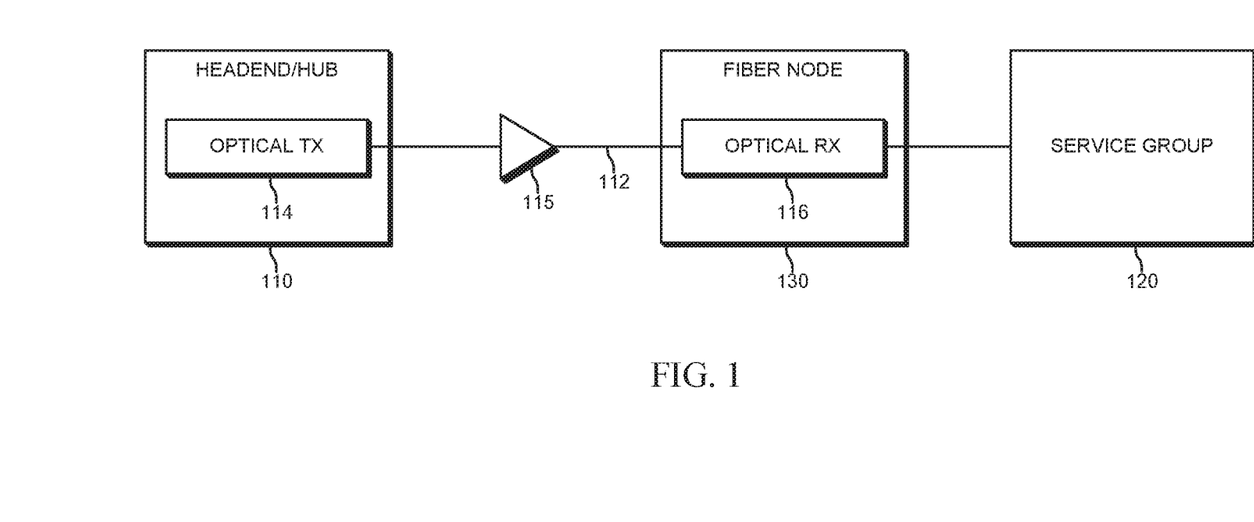
FIG. 1 illustrates an example optical communication system according to some embodiments.

FIG. 1 illustrates an example optical communication system 100 according to some embodiments. System 100 delivers analog and/or high-definition digital entertainment and telecommunications, such as video, voice, and high-speed Internet services, over a fiber connection 112 between a headend/hub 110 and fiber node 130 for delivery to a service group 120 of receiving devices such as cable modems (CMs) and/or set top boxes (STBs).

An optical transmitter (TX) 114 in the headend/hub 110 may convert electrical signals representing various services (e.g., video, voice, and Internet) to optical signals for transmission over the fiber 112 to the fiber node 130. The optical signal from the transmitter 114 may be amplified by an optical amplifier 115 (e.g., an erbium doped fiber amplifier (EDFA)) before reaching the fiber node 130. An example EDFA 115 is shown between headend/hub 110 and the fiber node 130, but it is noted that the EDFA 115 may be located in the headend/hub 110 and/or in the fiber node 130 or along the fiber.

A single fiber node 130 is shown in FIG. 1, but it should be understood that a network of nodes may exist between the headend/hub 110 and the service group 120 for delivery of cable services to consumers, and networks may be designed with fiber, coax, or a combination thereof for transmission of optical and/or electrical signals. In the example system shown in FIG. 1, the fiber node 130 includes an optical receiver (RX) 116 that converts the received optical signals to electrical signals. The electrical signals then are transmitted to service group 120.

In fiber transmission systems, especially long transmission systems, external modulator based transmitters may be used. Among external modulator technologies, electro-absorption laser (EML) based transmitters provide the required system performance. An EML based transmitter includes some unique performance advantages because of its extremely low chirp, its small package size, and its low cost. A chirp is a signal in which the frequency increases (up-chirp) or decreases (down-chirp) with time. EML based transmitters produce the external transmitter performance at a cost close to DFB based transmitters. Although EML transmitters are described, transmitters other than EML based transmitters that generate a photocurrent at the modulator may also be used.

For network implementations, such as an HFC network, the EA modulator can also offer good second order distortion performance if biased at the inflection point of its extinction ratio curve. However, for the external modulator, whether a LN MZ modulator or an EA modulator, the optimum bias voltage for the good second order distortion performance or even order distortion performance needs to be tightly controlled because the bias window for an acceptable second order performance is very narrow. MZI optical modulators fabricated in lithium niobate (LiNbO) have been shown to be sensitive to thermal and mechanical stresses that cause dynamic shifts of the quadrature bias point. For these reasons, the bias point of a typical external modulator may vary due to temperature variations, signal fluctuations, manufacturing tolerances and other environmental factors. If the proper bias point is not maintained, the modulator will exhibit stronger nonlinearity, especially even-order harmonics and the reduction of the signal strength in one of the outputs. The variations induced by stresses therefore require an active control to maintain an optimum distortion performance.

The electro-absorption modulator (EAM) may suffer from a similar problem when the modulator is packaged separately from a light source package, such as a laser package, and therefore may need similar tight control of the modulator bias as described for MZI based modulators. However, when integrated with the DFB laser, the modulator is hermetically packaged together with the laser in the EML laser module. For this reason, the temperature of the DFB laser and EAM are set the same and maintained because the temperature of both is controlled by a temperature source, such as a thermoelectric cooler (TEC). Therefore, in theory, the bias voltage of the EAM is not affected by the environmental temperature and some other conditions if the laser bias and EAM bias are stable.

Figure 2:
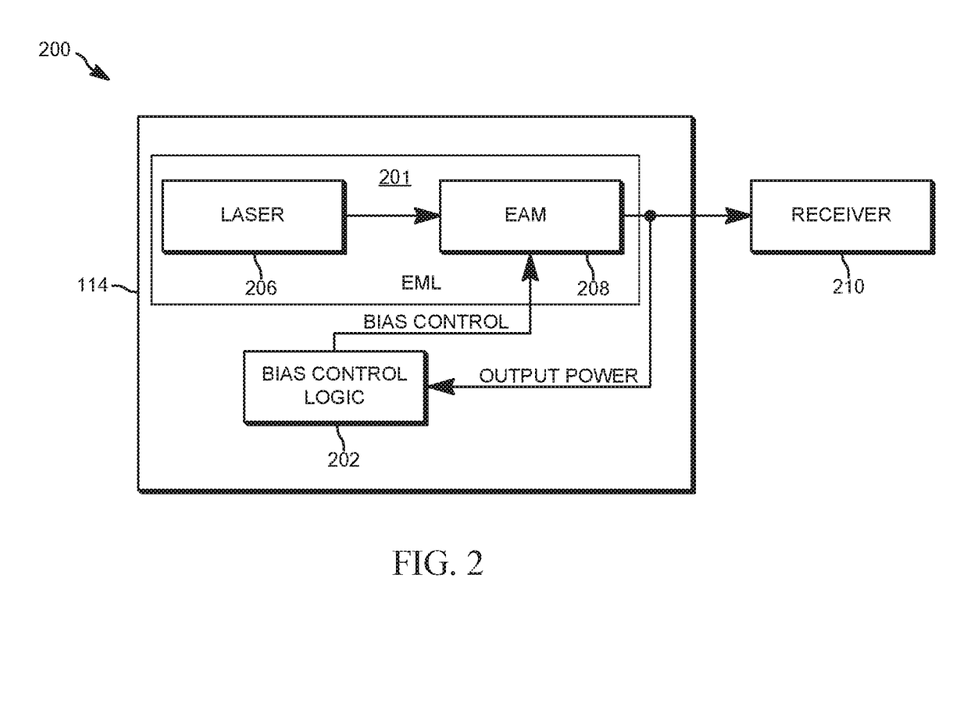
FIG. 2 depicts a simplified system for a transmitter that includes bias control logic for an electro-absorption modulated laser (EML) according to some embodiments.

Nevertheless, bias control for an EML is still needed. FIG. 2 depicts a simplified system 200 for transmitter 114 that includes bias control logic 202 for an EML 201 according to some embodiments. A light source, referred to as laser 206, may output a light that is received by EAM 208. EAM 208 absorbs the light, which is converted to photocurrent. Photocurrent is the electric current from EAM that is the result of exposure to radiant power. As described above, the effective band gap of the semiconductor of the absorption material changes with its bias voltage. When no bias is applied to EAM 208, the band gap is wide enough to allow the light at the laser wavelength to pass through transparently. As the bias voltage is increased, the band gap is narrowed enough to start absorbing the light. Therefore, EAM 208 with its changing bias voltage offers its capability of modulating light. The modulated light from EAM 208 is output by EML 201 and transmitted to a receiver 210, which may be an optical receiver at a node.

Figure 3:
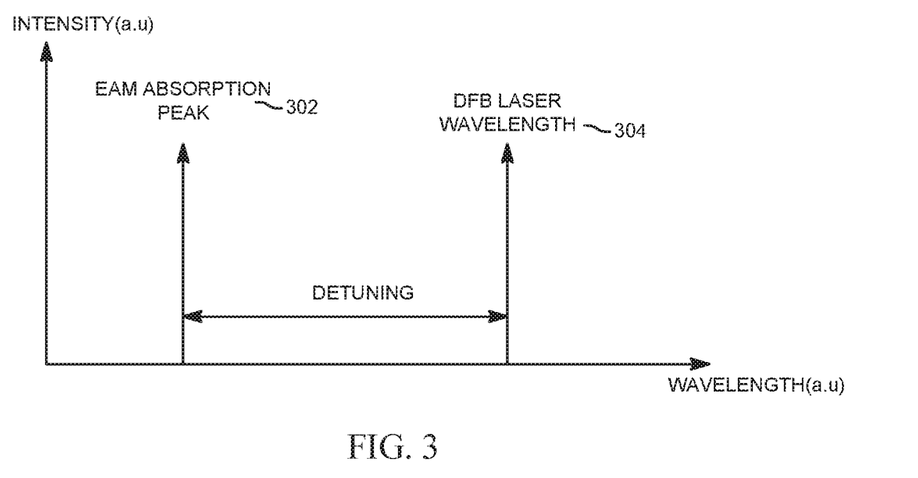
FIG. 3 depicts a graph showing the wavelength detuning relationship according to some embodiments.

The EAM modulation extinction ratio curve and thus the absorption are also a function of wavelength detuning. FIG. 3 depicts a graph showing the wavelength detuning relationship according to some embodiments. The graph shows that the detuning is defined as wavelength difference between the DFB laser wavelength at 304 and the EAM peak absorption wavelength at 302 according to some embodiments.

Figure 4:
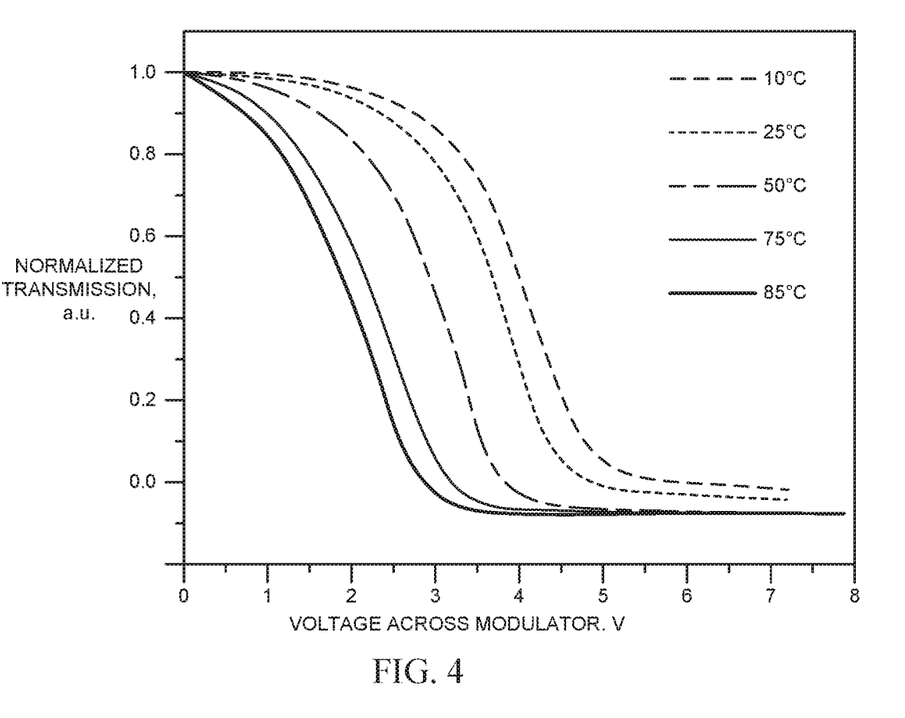
FIG. 4 depicts an example of extinction ratio curves versus different temperatures or detuning according to some embodiments.

Wavelength detuning can also be changed by the EML temperature because temperature coefficients of the EAM and the DFB are different. FIG. 4 depicts an example of ER curves versus different temperatures or detuning according to some embodiments. The detuning may result in a different absorption by the modulator, which changes a predetermined modulation performance that was set for the EAM 208 by an original bias voltage setting. In addition to the movement along the ER curve due to the bias voltage, the shape of the ER curve is also changed when the temperature changes. For example, the ER curve changes as the temperature changes from 10° C. to 85° C. Therefore, the EML transmitter performance in terms of modulation performance will degrade and the transmitter output power will vary because of the detuning change. It is strongly desirable to limit the EML detuning difference to maintain the transmitter performance.

The wavelength detuning, however, may not be constant through the lifetime of EML 201 because of the aging process of the laser. Throughout the lifetime of a laser, its threshold (e.g., the laser bias current at which the laser turns on and starts emitting light) becomes larger, and its slope efficiency becomes smaller because of laser aging effects. Thus, the laser output power becomes smaller over time for a fixed laser bias current. A transmitter automatic power control (APC) circuit can be used to increase the laser bias current to maintain a constant laser output power based on the photocurrent of laser 206, such as the current from a back-facet photodetector in the package of EML 201. Increasing the bias current of laser 206, however, causes the laser wavelength to change. The wavelength change with the laser bias current change may be due to a plasma effect and Joule heating effect.

The wavelength change due to the laser aging and APC circuit changing the bias current of laser 206 may cause the detuning change between the DFB laser wavelength and EAM peak wavelength. The transmitter performance of EML 201 is then affected due to the ER curve's deviation from the original ER curve due to the detuning. Accordingly, some embodiments adjust the EAM voltage bias to optimize and to regain the transmitter performance and transmitter output power.

Conventionally, the EAM bias was controlled by an optical coupler at the output of the EML that taps off a small portion of light power and feeds it to an optical receiver (e.g., a photo detector (PD)) to convert the optical signal back to an electrical signal. The converted electrical signal is then sent to a feedback and bias control (F/C) circuit. The feedback and bias control circuit may contain an RF amplifier and a filter network so that the distortion beat power can be extracted. Using the extracted distortion beat power as an indicator, the bias control circuit can be automatically adjusted to minimize the transmitter distortion. While effective in optimizing the bias automatically, this approach needs an optical coupler, a photo detector, and electronic feedback and tracking network that all add significant cost and some real estate to the EML transmitter in addition to some complexity in the product design. The optical coupler also adds some insertion loss and thus reduces the transmitter output power.

Another conventional approach uses electrical signals converted by the EAM, which allows the optical coupler and photodetector to be omitted. Unlike the system using the optical coupler and a photodetector to convert the optical signal back to the electrical signal for the feedback and bias control (F/C) network, the optical to electrical signal conversion is accomplished using the intrinsic nature of the EAM because the EAM itself functions as a photo detector. That is, the electro-absorption of the EAM converts a portion of optical power to electrical power. An RF coupler is attached to the EAM to tap off a portion of the signal. The tapped signal is then sent to the feedback and bias control circuit (F/C circuit) to automatically track the distortion beat power and control the EA modulator bias for an optimal distortion performance.

Despite the advantages of the second system over the first one in many aspects, both of them work based on the same principle, controlling the EA modulator bias based on tracked distortion beat power after the optical signal is converted back to the electrical signal. The approach may have some limitations. For example, the power of distortion beat at some targeted frequency may not be strong enough when the transmitter modulation signal's frequency band patterns or signal systems, such as National Television System Committee (NTSC) and Phase Alternating Line (PAL), are different for different applications. Another example is that for some other applications, the system setting may not be based on solely on analog distortion performance. In this case, the distortion beat power may not be a proper gauge for the bias control.

In some embodiments, an alternative way of automatic tracking and bias control is proposed in FIG. 2. Different from the above two approaches, this method uses a characteristic of EML 201 to control the transmitter output power and to maintain the transmitter performance. For example, bias control logic 202 monitors the output power of EAM 208 and adjust the bias voltage of EAM 208. This approach has the advantage that the output power can be monitored as a direct current (DC) value. Thus, monitoring the output power does not require any dependence on the modulation signal (e.g., the optical signal after modulation). To maintain the performance of the transmitter using the output power, the relationship of the detuning change of the transmitter and the temperature performance effect on the modulator extinction curve will be described.

The modulator ER curve moves and varies when a detuning change occurs. However, it is also seen in FIG. 4 that if the detuning change is not significant, the modulator extinction curve move is almost a shift of the original ER curve to a new position but the shape stays the same. This small detuning change can happen during the EML lifetime. For one example of an EML laser 206, a DFB laser is biased at 250 mA while the maximum laser current is 300 mA. The laser wavelength change versus laser bias change is 0.008 nm/mA. The wavelength change caused by the current change from 250 mA to 300 mA is 0.4 nm, which is the detuning change if the EML temperature stays constant. The 0.4 nm detuning change can be simulated by the temperature change knowing the fact that the wavelength change over temperature for both the DFB and EAM 208 is a lot larger than the wavelength change due to the laser bias change. For the EML, the temperature coefficient of the DFB is 0.1 nm/C and that of EAM is 0.4 nm/C. Therefore, 0.4 nm detuning change can be simulated by 0.4 nm/(0.4-0.1)=1.3 C temperature change. The lines in FIG. 4 can thus be used to visualize the change in the ER curve due to a detuning change by relating the change in the ER curve due to temperature change to the equivalent change due to a detuning change. The small DFB temperature can still cause some laser power change. The bias change due to the APC circuit is less than 4 mA, which introduces additional detuning change of 4*0.008=0.032 nm and can be ignored compared to 0.4 nm detuning change.

Figure 5:
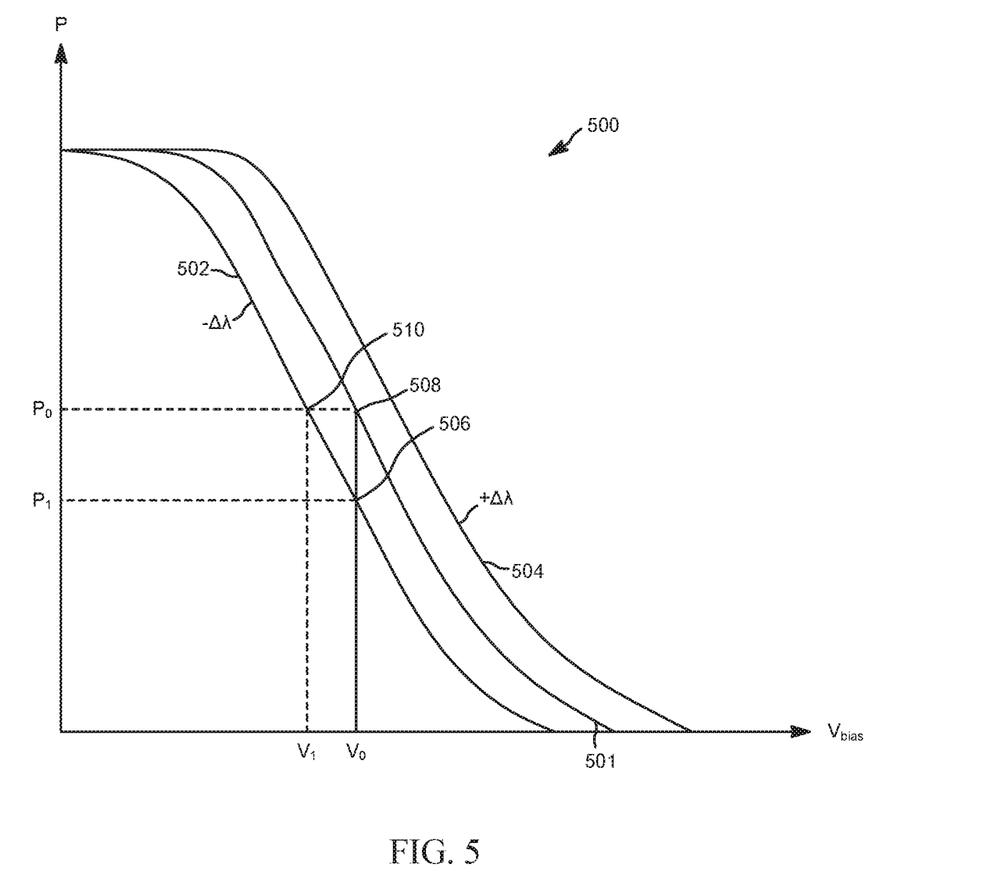
FIG. 5 depicts a graph that shows the shift of a modulator extinction curve due to a small detuning change Δλ according to some embodiments.

For a very small detuning change, the modulator extinction curve may only experience a very small shift and retains its shape. FIG. 5 depicts a graph 500 that shows the shift of a modulator extinction curve due to a small detuning change $\Delta\lambda$ according to some embodiments. The Y axis of graph 500 shows the EAM output power and the X axis shows the bias voltage Vbias for EAM 208. When EAM 208 is connected directly to an output of the EML transmitter, then the output power of the EML transmitter is the same as the output power of EAM 208. In this case, the output power of either maybe monitored. If a device is connected between the output of EAM 208 and the output of the EML transmitter, either output power may be monitored, but the power level may be different, but have the same characteristics of change.

At 502, a negative detuning change of $-\Delta\lambda$ causes the shown shift in the modulator extinction curve from 501 to 502. Also, a positive detuning change of $+\Delta\lambda$ causes the shift in the modulator extinction curve from 501 to 504. However, due to the shift, the EAM bias voltage moves off of a predetermined or best second order distortion bias point or predetermined or best even order distortion bias point and the transmitter output is no longer the same no matter how small the shift. The original bias point on curve 501 is at 508 for the bias voltage of $v_0$. Where the detuning is decreased by $-\Delta\lambda$, if the EAM stays at its original bias point, $v_0$, the EML output is changed from $P_0$ (point 508) to $P_1$ (point 506) because of the ER curve shift even though the transmitter APC circuit can still keep the DFB laser output the same. That is, the constant DFB back-facet photocurrent does not guarantee a constant transmitter output power. In this case, the transmitter output power becomes smaller, but the photocurrent from the EAM becomes larger. Likewise, the best distortion bias point is also missed because point 506 on curve 502 is not in the same position of point 508 on curve 501.

Since the modulator extinction curve after its shift due to a small detuning change can be deemed as the replica of the original modulator extinction curve, if the EA bias moves from voltage $v_0$ to voltage $v_1$, both the best distortion bias and the transmitter power are set back from a point 506 to a point 510 where the output power is similar compared to before the detuning change occurred (point 508 and point 510 have the same power $P_0$). Further, the position at 510 on the curve 502 is similar to the position 508 on the previous curve 501, which maintains the linear modulation properties of the EML output due to being around the inflection point of both curves. In the meantime, the EAM photocurrent is also set back to the same value due to the bias voltage change maintaining the same output power. That is, when the EAM photocurrent can be used as an indicator or monitoring parameter for bias EAM control circuit, maintaining the same EAM photocurrent maintains the best distortion bias and the transmitter output power simultaneously. Maintaining the best distortion bias and the transmitter output power is performed by attempting to keep the EAM output power substantially the same.

Figure 6:
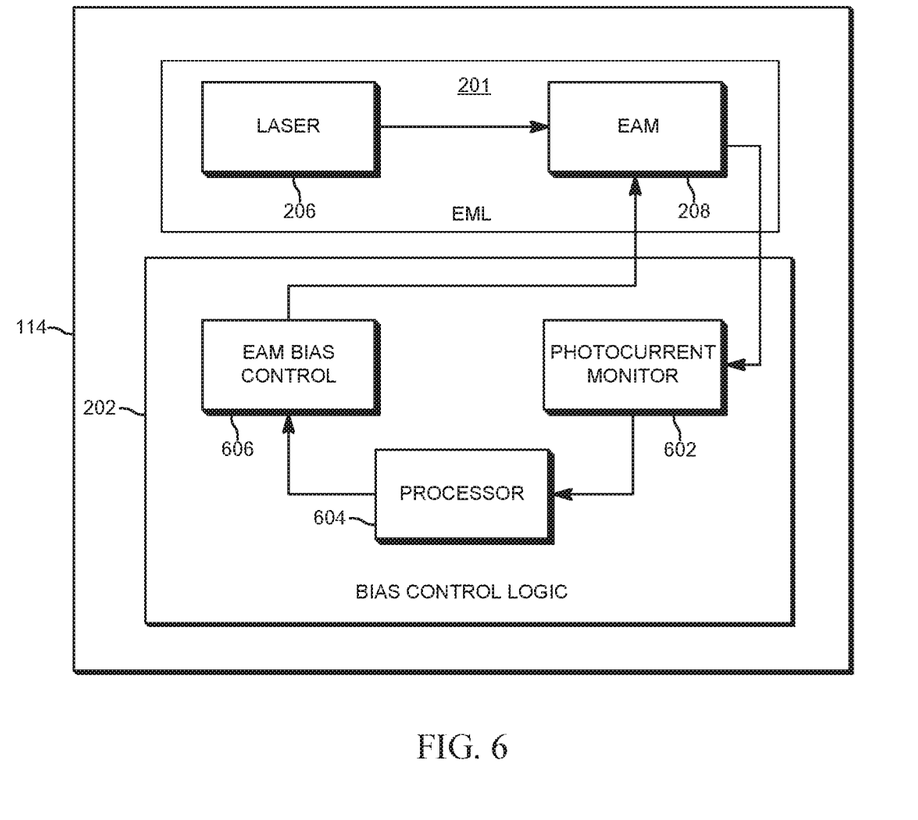
FIG. 6 depicts an example of bias control logic according to some embodiments.

FIG. 6 depicts an example of bias control logic 202 according to some embodiments. A photocurrent monitor 602 monitors the EAM photocurrent. A processor 604 then processes the changes in the photocurrent and sends a signal for the changes to an EAM bias control 606. EAM bias control 606 may then generate a new bias voltage for EAM 208. Then, photocurrent monitor 602 monitors the change in photocurrent based on the adjustment in the bias voltage. This adjustment continues until the original EAM photocurrent is achieved. The adjusting of the bias voltage maintains the photocurrent the same, and keeps the output power of EAM 208 constant, which maintains the output power of EML 201. Although monitoring a change in photocurrent is discussed, the photocurrent can be monitored in different forms that allow the output power of EAM 208 to be monitored, such as monitoring the voltage that is proportional to the photocurrent or power of EAM 208. Changing the bias voltage of EAM 208 maintains the output power and a predetermined modulation performance. However, the signal output or distortion beats after modulation by EAM 208 is not used to adjust the bias voltage.

Figure 7:
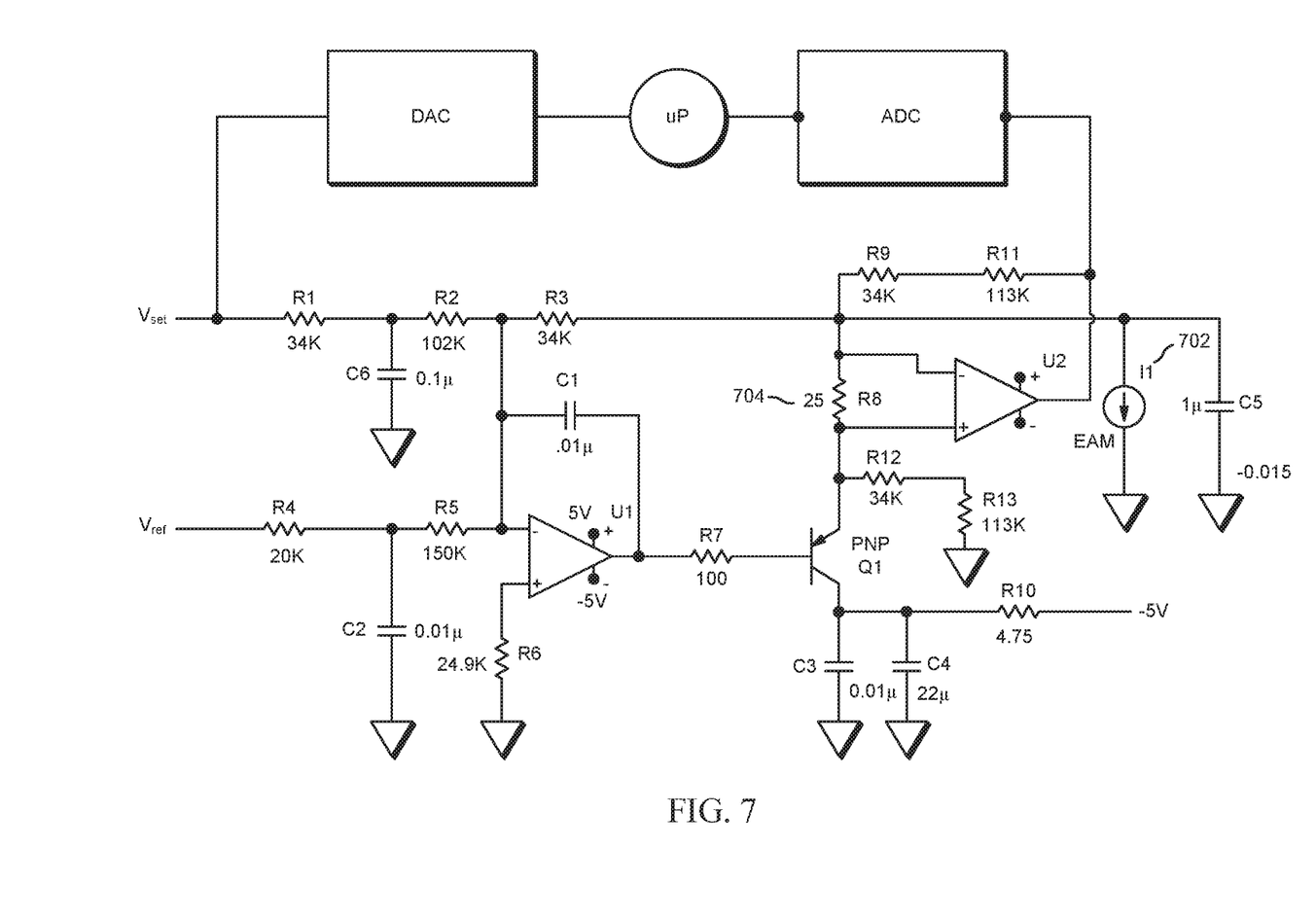
FIG. 7 shows an example circuit that monitors the EAM photocurrent and feeds the current back to the EAM bias control circuit to generate a new bias voltage according to some embodiments.

FIG. 7 shows an example circuit that monitors the EAM photocurrent and feeds the current back to the EAM bias control circuit to generate a new bias voltage according to some embodiments. In the circuit, EAM 208 is biased by a voltage source, composed of an op-amp U1 and a transistor Q1, that provides a constant bias voltage. When there is EAM photocurrent change, the photocurrent change at 702 can be sensed by the resistor R8 at 704. The sensed photocurrent is sent to the processor 604 through an analog to digital convertor (ADC) and then a new bias voltage, Vset, is then sent to the control voltage of the voltage source through a digital to analog convertor (DAC). EAM bias control 606 sets a new bias voltage Vset to maintain the voltage across resistor R8. This adjustment continues until the original EAM photocurrent is achieved.

Figure 8:
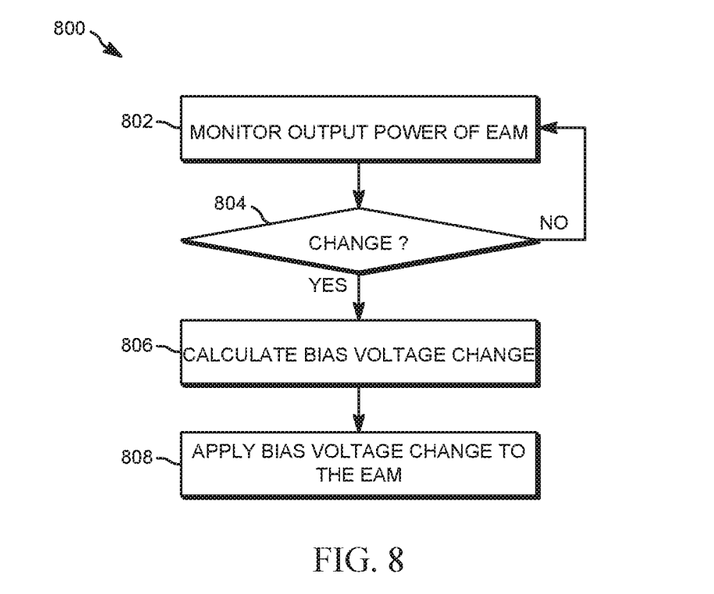
FIG. 8 depicts a simplified flowchart for adjusting the EAM bias voltage according to some embodiments.

FIG. 8 depicts a simplified flowchart 800 for adjusting the EAM bias voltage according to some embodiments. At 802, bias control logic 202 monitors output power of EAM 208. At 804, bias control logic 202 determines if the output power changes. If not, the monitoring continues.

If the output power changes, then bias control logic 202 calculates a bias voltage change to maintain the output power. Then, at 808, bias control logic 202 applies the bias voltage change to EAM 208.

Figure 9:
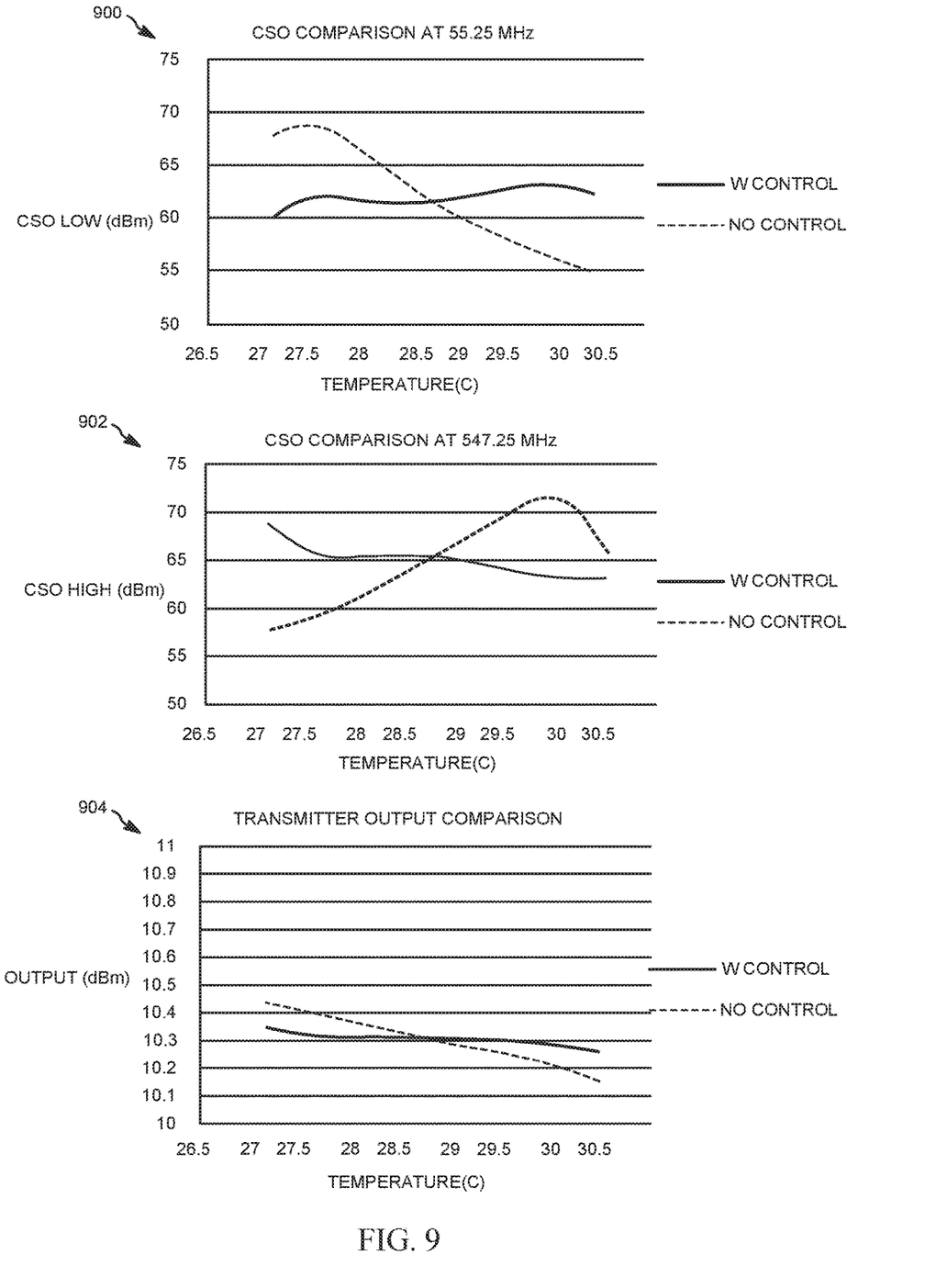
FIG. 9 shows an example of composite second order performance according to some embodiments.

FIG. 9 shows an example of composite second order performance according to some embodiments. The EML temperature was originally set to 28.5 C and then was tuned to 28.5 C+/−1.5 C. The transmitter was loaded with 79 analog subcarriers and 75 QAM channels at −6 dB relative to the subcarrier power to make a total bandwidth of 1 GHz. The composite second order (CSO) beats are measured and monitored at around 55.25 MHz at 900 and 547.25 MHz at 902 where the most distortion beats happen. With EAM bias automatic control, the EAM photocurrent composite second orders and transmitter output power as shown at 904 are maintained for the temperature range and without automatic control, the composite second orders are degraded. The process proposed here is therefore effective or else the distortion performance and output power of the transmitter will be degraded without the automatic EAM bias control circuit in the case that the temperature change causes ER curve shift and the transmitter performance in terms of output power and distortion performance are changed even though the APC circuit can still maintain the DFB laser output power.

It is noted that the circuit depicted in FIG. 7 only serves as an example. Therefore, the photocurrent sensing can be performed in other ways. Although the laser wavelength coefficient due to bias current and the wavelength temperature coefficient for both DFB laser 206 and EAM 208 are used in the previous calculation, the proposed process is valid without knowledge of these coefficients because the magnitudes of the wavelength change caused by DFB laser bias current change and temperature change are similar and the method only relies on monitoring photocurrent of EAM 208 and therefore the principle still holds without knowing the actual coefficients.

With the method proposed here, it is possible to not only automatically adjust the EML's bias for maintaining the targeted performance and output power but the process can also be used for maintaining the wavelength of EML 201. As mention earlier, the APC circuit can maintain the DFB laser output power by increasing the laser bias current but it also changes the laser wavelength. In DWDM applications, nevertheless, the EML transmitters' wavelength should also be maintained due to the narrow filter bandwidth in the multiplexer (MUX) and the demultiplexer (DEMUX). The wavelengths in a DWDM system should be maintained also to avoid some system performance degradation due to some undesired fiber nonlinearities, such as four wave mixing. Wavelength maintenance by the laser temperature tuning and APC can also cause detuning change. The method given here can also be used to maintain the transmitter performance while the wavelength is tuned to be constant.

Some embodiments may be implemented in a non-transitory computer-readable storage medium for use by or in connection with the instruction execution system, apparatus, system, or machine. The computer-readable storage medium contains instructions for controlling a computer system to perform a method described by some embodiments. The computer system may include one or more computing devices. The instructions, when executed by one or more computer processors, may be configured to perform that which is described in some embodiments.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments along with examples of how aspects of some embodiments may be implemented. The above examples and embodiments should not be deemed to be the only embodiments, and are presented to illustrate the flexibility and advantages of some embodiments as defined by the following claims. Based on the above disclosure and the following claims, other arrangements, embodiments, implementations and equivalents may be employed without departing from the scope hereof as defined by the claims.

What is claimed is:

1. An apparatus comprising:
    an electro-absorption modulator configured to receive an optical light from an optical light source and output a modulated optical signal, the electro-absorption modulator including a bias voltage used to set a predetermined modulation performance and an output power of the electro-absorption modulator; and
    a controller configured to measure a DC value of the output power provided by the electro-absorption modulator and use the DC value as a reference to automatically control the bias voltage of the electro-absorption modulator to maintain the predetermined modulation performance and the output power of the electro-absorption modulator when a detuning change occurs between the electro-absorption modulator and the optical light source.

2. The apparatus of claim 1, further comprising:
    an automatic power control circuit that controls a bias current of the optical light source to maintain a same output power from the optical light source.

3. The apparatus of claim 2, wherein a wavelength of the optical light source is changed by changing the bias current of the optical light source.

4. The apparatus of claim 1, wherein the bias voltage is controlled to maintain a constant photocurrent generated by the electro-absorption modulator.

5. The apparatus of claim 1, wherein the controller comprises:
    a monitor configured to monitor the photocurrent of the electro-absorption modulator;
    a processor configured to set a reference voltage; and
    bias control logic configured to control the electro-absorption modulator bias voltage based on the reference voltage.

6. The apparatus of claim 1, wherein the controller comprises:
    a monitoring circuit that measures the photocurrent of the electro-absorption modulator without using an optical coupler and a photodetector;
    an electrical feedback circuit that generates a reference signal based on the photocurrent and a targeted photocurrent level; and
    a voltage source or current source that controls the bias voltage of the electro-absorption modulator based on the reference signal.

7. The apparatus of claim 1, wherein an output power of the electro-absorption modulator is maintained by controlling the bias voltage of the electro-absorption modulator.

8. The apparatus of claim 1, wherein the controller maintains modulation linearity by controlling the bias voltage.

9. The apparatus of claim 1, wherein the controller minimizes second order distortion changes that occur based on the detuning change by controlling the bias voltage.

10. The apparatus of claim 1, wherein the controller minimizes even order distortion that occurs based on the detuning change by controlling the bias voltage.

11. The apparatus of claim 1, further comprising:
    a temperature control circuit configured to maintain a temperature of the optical light source and the electro-absorption modulator.

12. The apparatus of claim 1, wherein the optical light source comprises a distributed feedback laser (DFB) laser.

13. The apparatus of claim 1, wherein the optical light source and the electro-absorption modulator are located in a same package.

14. The apparatus of claim 1, further comprising a temperature control circuit configured to set and maintain a temperature of both the optical light source and the electro-absorption modulator.

15. The apparatus of claim 1, wherein the optical light source and the electro-absorption modulator form an electro-absorption modulated laser.

16. A method comprising:
receiving, at an electro-absorption modulator, an optical light from an optical light source and outputting a modulated optical signal, the electro-absorption modulator including a bias voltage used to set a predetermined modulation performance and an output power of the electro-absorption modulator; and
measuring a DC value of the output power provided by the electro-absorption modulator; and
using the DC value as a reference to automatically control the bias voltage of the electro-absorption modulator to maintain the predetermined modulation performance and the output power of the electro-absorption modulator when a detuning change occurs between the electro-absorption modulator and the optical light source.

17. The method of claim 16, wherein the bias voltage is controlled to maintain a constant photocurrent generated by the electro-absorption modulator.

18. The method of claim 17, further comprising:
monitoring the photocurrent of the electro-absorption modulator;
setting a reference voltage; and
controlling the bias voltage based on the reference voltage.

19. The method of claim 16, wherein the bias voltage is controlled to maintain a constant photocurrent generated by the electro-absorption modulator.

20. A system comprising:
an optical light source configured to output an optical light;
an electro-absorption modulator configured to receive the optical light and output a modulated optical signal, the electro-absorption modulator including a bias voltage used to set a predetermined modulation performance and an output power of the electro-absorption modulator; and
a controller configured to measure a DC value of the output power provided by the electro-absorption modulator and use the DC value as a reference to automatically control the bias voltage of the electro-absorption modulator to maintain the predetermined modulation performance and the output power of the electro-absorption modulator when a detuning change occurs between the electro-absorption modulator and the optical light source.

* * * * *